United States Patent
Yoon et al.

(10) Patent No.: US 11,124,870 B2
(45) Date of Patent: Sep. 21, 2021

(54) TRANSFER-FREE METHOD FOR PRODUCING GRAPHENE THIN FILM

(71) Applicant: WITHUSTECH CO., LTD., Daejeon (KR)

(72) Inventors: Soon-Gil Yoon, Daejeon (KR); Byeong-Ju Park, Daejeon (KR)

(73) Assignee: KUK-IL GRAPHENE CO., LTD., Seoul (KR)

( * ) Notice: Subject to any disclaimer, the term of this patent is extended or adjusted under 35 U.S.C. 154(b) by 245 days.

(21) Appl. No.: 15/994,184

(22) Filed: May 31, 2018

(65) Prior Publication Data

US 2018/0347033 A1 Dec. 6, 2018

(30) Foreign Application Priority Data

Jun. 1, 2017 (KR) .......................... 10-2017-0068344
Oct. 26, 2017 (KR) .......................... 10-2017-0140443

(51) Int. Cl.
*C23C 16/26* (2006.01)
*C23C 14/34* (2006.01)
(Continued)

(52) U.S. Cl.
CPC ............ *C23C 16/26* (2013.01); *C23C 14/042* (2013.01); *C23C 14/185* (2013.01);
(Continued)

(58) Field of Classification Search
CPC ..... C23C 14/14; C23C 14/185; C23C 14/205; C23C 16/26; C23C 16/042; C23C 16/50; C23C 16/505
See application file for complete search history.

(56) References Cited

U.S. PATENT DOCUMENTS 10,246,795 B2 * 4/2019 Yoon ...................... C30B 25/186
2013/0187097 A1 * 7/2013 Hong ...................... C23C 16/26
252/510
2017/0153200 A1 * 6/2017 Komoto ................... B32B 27/36

FOREIGN PATENT DOCUMENTS

JP    2016-037434 A    3/2016
KR    10-2012-0099917 A    9/2012
(Continued)

OTHER PUBLICATIONS

Shuangli Ye et al, Thickness-Dependent Strain Effect on the Deformation of the Graphene Encapsulated Au Nanoparticles, Journal of Nanomaterials vol. 2014, Jan. 2014.*
(Continued)

*Primary Examiner* — John J Brayton
(74) *Attorney, Agent, or Firm* — Mintz, Levin, Cohn, Ferris, Glovsky and Pope, P.C.; Joohee Lee

(57) ABSTRACT

The present invention relates to a transfer-free method for producing a graphene thin film, which may form a high-quality graphene layer having excellent crystallinity on a substrate without a transfer process, and to a method of fabricating a device using the transfer-free method. More specifically, the present invention relates to a transfer-free method for producing a graphene thin film and a method for fabricating a device using the transfer-free method, the methods including the steps of: (A) forming a titanium buffer layer on a target substrate; and (B) growing a graphene thin film on the titanium buffer layer, wherein process are performed in an oxygen-free atmosphere throughout the steps (A) to (B).

14 Claims, 12 Drawing Sheets

(51) Int. Cl.
  *C23C 16/50* (2006.01)
  *C23C 14/04* (2006.01)
  *C23C 14/18* (2006.01)
  *C23C 14/20* (2006.01)
  *H01G 4/33* (2006.01)
  *H01G 4/008* (2006.01)
  *H01B 1/04* (2006.01)
  *H01B 13/00* (2006.01)
  *C23C 16/04* (2006.01)
  *C23C 16/505* (2006.01)
  *H01G 4/08* (2006.01)
  *H05K 1/16* (2006.01)
  *H01G 4/12* (2006.01)

(52) U.S. Cl.
  CPC ............ *C23C 14/205* (2013.01); *C23C 14/34* (2013.01); *C23C 16/042* (2013.01); *C23C 16/50* (2013.01); *C23C 16/505* (2013.01); *H01B 1/04* (2013.01); *H01B 13/0036* (2013.01); *H01G 4/008* (2013.01); *H01G 4/085* (2013.01); *H01G 4/33* (2013.01); *H05K 1/162* (2013.01); *H01G 4/1254* (2013.01)

(56) References Cited

FOREIGN PATENT DOCUMENTS

| KR | 10-2014-0003218 A | 1/2014 |
| KR | 10-2014-0129875 A | 11/2014 |
| KR | 10-1475460 B1 | 12/2014 |
| KR | 10-2016-0005504 A | 1/2016 |
| KR | 10-2017-0035323 A | 3/2017 |
| KR | 10-2017-0112908 A | 10/2017 |

OTHER PUBLICATIONS

Office Action dated Apr. 18, 2019 in corresponding Korean Application No. 10-2017-0140443.

J. Jang et al., "Low-temperature-grown continuous graphene filsm from benzene by chemical vapor deposition at ambient pressure", Scientific Reports, 5:17955, pp. 1-7 (2015).

Large-Scale High Quality Monolayer Graphene Grown Directly at 150° C. via Plasma-Assisted Thermal CVD, dated May 10, 2017, http://physics.sejong.ac.kr/bbs/view.php?id=news_seminar&no=136, English Abstract.

* cited by examiner

TRANSFER-FREE METHOD FOR PRODUCING GRAPHENE THIN FILM

CROSS-REFERENCE TO RELATED APPLICATION

This application claims priority to Korean Application No. 10-2017-0068344 filed Jun. 1, 2017 and Korean Patent Application No. 10-2017-0140443 filed Oct. 26, 2017 which applications are incorporated herein by references.

BACKGROUND OF THE INVENTION

Field of the Invention

The present invention relates to a transfer-free method for producing a graphene thin film, which can form a high-quality graphene layer having excellent crystallinity on a substrate without a transfer process, and to a method of fabricating a device using the transfer-free method.

Description of the Prior Art

Graphene is a two-dimensional hexagonal sheet composed of $sp^2$-bonded carbon atoms, and its physical strength is at least 200 times higher than that of steel. Graphene has a thermal conductivity which is about 10 times higher than that of a metal such as copper or aluminum, and it has very high electron mobility, and thus has resistance which is at least 35% lower than that of copper at room temperature. In addition, it shows an anomalous hall effect at temperatures higher than room temperature. Thus, graphene has been reported to have interesting physical and electrical properties. Due to such properties, in recent years, studies on the production of high-quality graphene and on the application of graphene to devices have been actively conducted.

Graphene can generally be produced by four methods: a mechanical exfoliation method, a chemical method employing a reducing agent, an epitaxial method employing a silicon carbide insulator, and a chemical vapor deposition (CVD) method.

In recent years, a technique has been developed which includes producing a graphene thin film on a catalytic metal such as nickel, copper, Ga or Ge, formed to have a thickness of about μm, by chemical vapor deposition using methane gas. According to the chemical vapor deposition method, it is possible to control the number of graphene layers by controlling the kind and thickness of catalyst, the reaction time, the concentration of reactive gas, etc. In addition, graphene produced by this method have the best properties, and this method makes it possible to produce graphene in large amounts.

However, formation of a graphene thin layer by chemical vapor deposition has limitations in that it necessarily requires a transfer process and requires deposition at high temperatures. Namely, in order to deposit a graphene thin film by chemical vapor deposition, a metal catalyst layer formed to have a thickness of about μm is required. However, the metal catalyst layer changes the electrical and optical properties of a base substrate on which the graphene thin film is formed, and thus it also adversely affects the properties of a transparent electrode or semiconductor device including the graphene thin film. In addition, since deposition of a graphene thin film by chemical vapor deposition is performed at a temperature as high as about 1000° C. in order to crystallize graphene, deformation of the base substrate may occur during the deposition process when the base substrate has low heat resistance. For this reason, in order to actually use a graphene layer, formed by chemical vapor deposition, for an electrode or a device, a process of exfoliating a graphene layer grown on a catalytic metal and transferring the exfoliated graphene layer onto a base substrate is necessarily required.

A graphene transfer method which is generally used includes: forming a graphene layer on a catalytic metal; removing the catalytic metal by etching using PDMS (polydimethylsiloxane) or PMMA (polymethylmethacylate) as a support layer; transferring the graphene layer onto a base substrate; and then removing the support layer. However, there is a problem in that, due to mechanical deformation (wrinkle, ripple, etc.) of graphene in the transfer process, residue of the etchant used to remove the catalytic metal, and the like, many defects are formed at the interface between the transferred graphene layer and the base substrate, and for this reason, the behavioral characteristics of a device including a heterojunction of the graphene layer and the base substrate are deteriorated. Residue of the support layer of transfer may also reduce the conductivity and transparency of graphene and increase the surface roughness of graphene.

In addition, the transfer process is inevitably costly, causes environmental problems due to wastewater, and is difficult to apply to mass production. For this reason, a more fundamental solution to the problem is to develop a method of forming a graphene thin film directly on a thin film without going through a transfer process.

To this end, introduction of a metal layer required to form a graphene layer by chemical vapor deposition should not affect the electrical and optical properties of a base substrate. However, a study thereon has not yet been reported.

Even though the metal layer does not affect the electrical and optical properties of the base substrate, low-temperature vapor deposition should be possible in order to form a graphene layer directly on a flexible substrate which has recently attracted attention as a base substrate for a semiconductor device. However, 300° C., at which graphene was deposited on a 25-μm-thick copper foil by an oxygen-free atmospheric pressure CVD (APCVD) method using benzene as reported by Jang et al. (Sci. Rep. 5, 17955, 2015), has been reported as the lowest temperature among the reported temperatures at which a graphene thin film was deposited by chemical vapor deposition. The graphene thin film obtained by the above method showed a value of $I_D/I_G$=0.1 to 0.2. Polyimides have been most widely used for base substrates in flexible devices, and have a glass transition temperature of about 300° C. Among these polyimides, Kapton polyimide is thermally stable at a temperature of up to about 400° C., indicating that it can be applied even in a relatively high-temperature process. However, the temperature of the process for forming a graphene layer is still high such that chemical vapor deposition cannot be applied to a polyimide-based synthetic resin that is used for a base substrate, and the polyimide-based synthetic resin is also costly. For this reason, it is strongly required to develop a base substrate having high heat resistance and to lower the process temperature so that the process can be applied even to polyethylene (PE), polyethylene terephthalate (PET), polycarbonate (PC), polyether sulfone (PES) and the like, which are inexpensive, but the application of which to base substrates is limited due to their low heat resistance.

The present inventors reported that when a Ti buffer layer having a thickness of 3 to 20 nm was used, a graphene thin film could be formed even at a temperature equal to or lower than 300° C. (Korean Patent Application Publication No.

10-2016-0105001). It was attempted to apply this Ti buffer layer directly to fabrication of a device, but it was difficult to substantially grow a graphene thin film up to a size on the order of mm or cm, even when the Ti buffer layer was pretreated in a hydrogen atmosphere before graphene growth. In order to apply a graphene thin film to devices, it is required that the thin film be grown up to a size on the order of mm or cm. For this reason, in order to actually apply a method for growth of a graphene thin film, it is required to develop a method for growth of a large-area graphene thin film.

SUMMARY OF THE INVENTION

The present invention has been made in order to solve the problems occurring in the prior art, and an object of the present invention to provide a substantial method capable of forming a large-area and high-quality graphene without changing the electrical and optical properties of a substrate, by omitting a transfer process.

Another object of the present invention is to provide a method for fabricating an electronic device having formed therein a graphene thin film, which may be applied to a method for fabricating a flexible transparent device.

To achieve the above objects, the present invention provides a transfer-free method for producing a graphene thin film, including the steps of: (A) forming a titanium buffer layer on a target substrate; and (B) growing a graphene thin film, wherein entire steps throughout (A) to (B) are performed in an oxygen-free atmosphere.

In order to obtain a multilayer graphene thin film, the steps of forming the titanium buffer layer and the graphene thin film are repeated predetermined times after step (B).

As used herein, the term "target substrate" refers to a substrate, such as a transparent electrode or a semiconductor device, on which a graphene layer is to be formed and used. In a conventional method for forming a graphene layer, which includes a transfer process, the target substrate corresponds to a substrate onto which a graphene layer is finally transferred. Although the material or shape of the target substrate is not limited, the target substrate is preferably made of glass, a metal oxide, $SiO_2$, or a polymer, such as PET (polyethylene terephthalate), PES (polyether sulfone), PC (polycarbonate) or polyimide, which contains oxygen in the structure thereof, because Ti forms a strong bond with the target substrate by a chemical bond between Ti and the oxygen atom. Characteristically, according to the present invention, a high-quality graphene layer can be formed at a low temperature of 400° C., 300° C., or even 150° C., and thus a flexible substrate may be used.

In the present invention, deposition of the titanium buffer layer may be performed by a method selected from the group consisting of sputtering, atomic layer deposition (ALD), plasma-enhanced atomic layer deposition (PE-ALD), thermal evaporation, thermal oxidation, e-beam evaporation, molecular beam epitaxy (MBE), pulsed laser deposition (PLD), chemical vapor deposition (CVD), a sol-gel method, and combinations thereof, but is not limited thereto.

In the present invention, formation of the graphene thin film may be performed by a chemical vapor deposition method selected from the group consisting of plasma-enhanced chemical vapor deposition (PECVD), rapid thermal chemical vapor deposition (RTCVD), inductively coupled plasma-chemical vapor deposition (ICP-CVD), low-pressure chemical vapor deposition (LPCVD), atmospheric pressure chemical vapor deposition (APCVD), metal organic chemical vapor deposition (MOCVD), atomic layer deposition (ALD), plasma-enhanced atomic layer deposition (PE-ALD), and combinations thereof, but is not limited thereto.

When the thickness of the titanium buffer layer formed in step (A) is 10 to 20 nm, the titanium buffer layer does not change the optical and electrical properties of the target substrate. If the thickness of the titanium buffer layer is thinner than 10 nm, the thickness of the titanium buffer layer may not be uniform. If there is a technological advance capable of uniformly forming the titanium buffer layer, it will also be possible to form a titanium layer thinner than 10 nm. If the thickness of the titanium buffer layer exceeds 20 nm, light transmittance will be decreased rapidly. However, for devices whose light transmittance does not become a problem, no problem will arise even if the thickness of the titanium layer exceeds 20 nm. A titanium buffer layer formed to have a thin thickness of 10 to 20 nm showed no change in light transmittance even when it was annealed at a temperature of 150 to 400° C. Thus, when the titanium buffer layer is formed to have a thickness of 10 to 20 nm, high-quality graphene can be grown over a large area on the target substrate without changing the electrical and optical properties of the target substrate, indicating that it is possible to grow graphene directly on a desired target substrate without requiring an additional transfer process.

Meanwhile, when a thin film of nickel or copper, which is used as a catalytic metal in conventional chemical vapor deposition, was formed to have a thickness of 10 to 20 nm, the surface roughness or transmittance thereof greatly changed when it was annealed at 150° C., indicating that it is not suitable as a catalytic layer for transfer-free direct growth.

The present invention is characterized in that the process from the step of depositing the titanium buffer layer to the step of completely growing a graphene thin film thereon is performed in an oxygen-free atmosphere. If there is a process of transporting/storing the titanium buffer layer after deposition thereof, this process is also maintained in an oxygen-free atmosphere. In the following Examples, the step of depositing the titanium buffer layer and the step of forming the graphene thin film were performed in-situ in the same system, and thus maintained in an "oxygen-free atmosphere".

Titanium rapidly forms titanium oxide by reaction with oxygen in air. It is known that titanium oxide is rapidly reduced by hydrogen plasma treatment or annealing in a hydrogen atmosphere. However, when graphene was grown ex-situ on a substrate transferred to a chemical vapor deposition system immediately after deposition of titanium on the substrate, like the production of graphene by conventional known chemical vapor deposition using a catalytic layer formed of a metal catalyst layer such as Ni, Cu or the like, it was impossible to produce a large-area graphene thin film, because titanium oxide remaining on the target substrate acted as defects, even when annealing was performed in a hydrogen atmosphere before growth of graphene. No graphene was grown on titanium oxide, unlike titanium, and thus large-area graphene substantially free of defects could not be obtained by the ex-situ method.

In comparison with this, according to the present invention, a defect-free, monocrystalline graphene thin film could be obtained by maintaining an "oxygen-free atmosphere" through a method of depositing a titanium buffer layer and then growing graphene by plasma-enhanced chemical vapor deposition in the same system. The $I_D/I_G$ of the graphene thin film produced by the method of the present invention was 0.03 or less, which was very excellent.

An AFM image of the graphene produced by the present invention did not show any mechanical defects such as wrinkles. In addition, it could be seen that the graphene thin film produced by the method of the present invention was composed of monolayer graphene.

In the method of the present invention, the temperature of the target substrate during the growth of graphene may be 400° C. or below. Where other reaction conditions are the same, even a growth temperature above 400° C. does not become a problem, because the crystallinity of graphene increases as the temperature increases. However, as the temperature increases, the production cost increases, and the kind of target substrate that can be applied is limited. For this reason, it is preferable that the temperature is 400° C. or below. Furthermore, according to the present invention, the temperature of the target substrate during the growth of graphene may be 100 to 300° C., and it was possible to grow a high-quality monolayer graphene thin film even at a temperature of 150 to 200° C. Among flexible target substrates, Kapton known to be thermally stable at a temperature of up to 400° C. is widely used due to its relatively high heat resistance, but is costly. Polymer resins, such as polyethylene, polyethylene terephthalate, polycarbonate, or polyether sulfone, are cheap, but are deformed due to their low heat resistance in a process of fabricating flexible substrates, and for this reason, the use of these polymer resins has been limited. However, the present invention made it possible to form a graphene layer even at a low temperature of 150° C., and the characteristics of graphene measured on Raman spectra showed defect-free monocrystalline characteristics.

In the following Examples, a plasma-enhanced chemical vapor deposition system was used. In this regard, detailed operating conditions can be suitably controlled according to the characteristics of the system used. A reactive gas that is used for the growth of graphene may include, as a carbon source, one or more selected from the group consisting of methane, ethane, propane, acetylene, methanol, ethanol and propanol, but is not limited thereto. In addition, inert gas such as argon or helium as an atmosphere gas may be supplied together with the reactive gas during the growth of graphene. Furthermore, to prevent an oxidation reaction from occurring during the growth of graphene, a mixture of hydrogen gas and carbon gas is more preferably used as the reactive gas.

As described in the following Examples, according to the method of the present invention, a graphene thin film having a size of centimeters can be produced on a target substrate even without a transfer process. In the following Examples, the production of a graphene thin film having a size of 4×4 cm$^2$ was described, but this size is due to the size limitation of the system used in the Examples.

In another aspect, the present invention, the present invention is directed to a transfer-free method for fabricating an electronic device, to which the transfer-free method is directly applied and which includes the steps of: (A) forming a titanium buffer layer on a target substrate; and (B) growing a graph thin film on the titanium buffer layer, wherein entire steps throughout (A) to (B) are performed in an oxygen-free atmosphere.

It is to be understood that examples of the electronic device include all devices to which a conventional graphene junction device has been applied. Namely, the electronic device may be any component including a graphene electrode, and examples thereof include, but are not limited to, capacitors, displays, organic field-effect transistors, solar cells, LEDs, etc.

The method may further include, before step (A) or (B), a step of forming a masking pattern having a predetermined shape. Formation of the masking pattern makes it possible to easily form a graphene pattern even without an additional process such as a graphene etching process.

Terms, materials, system, method and the like, which are related to the "transfer-free method for fabricating the electronic device", are the same as those in the "transfer-free method for producing the graphene thin film", and thus an additional description thereof is omitted.

DETAILED DESCRIPTION OF THE INVENTION

Figure 1:
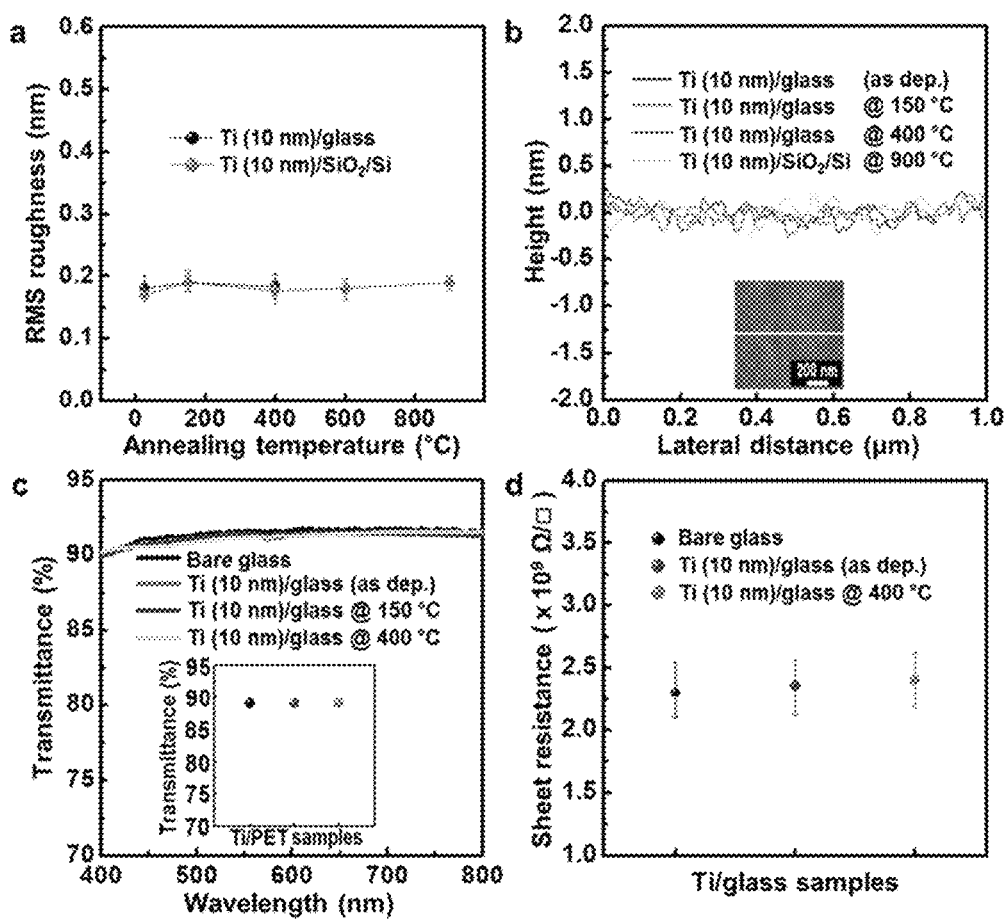
FIG. 1 depicts graphs showing surface roughness, transmittance and sheet resistance characteristics before and after annealing of titanium buffer layers.

The present invention is characterized in that (1) it is a "transfer-free" method in which a buffer layer does not need to be removed, because the mechanical, electrical and optical properties of a substrate or a graphene layer are not impaired by the buffer layer, and (2) a flexible device/transparent electrode can be fabricated using a target substrate made of a "flexible" polymer material, because a graphene layer is deposited with high quality even at low temperatures.

Hereinafter, the present invention will be described in further detail with reference to examples. It is to be understood, however, that these examples are for illustrative purposes only and are not intended to limit or change the scope of the present invention. In addition, those skilled in the art will appreciate that various modifications and alterations are possible based on this illustration, without departing from the scope and spirit of the invention.

In the following Examples, for graphene production at various temperatures, considering the temperature characteristics of substrates, a target substrate made of SiO$_2$ (250 nm)/Si (001) or glass was applied at high temperatures, and a target substrate made of PET was applied otherwise.

In the Examples, a prepared graphene/Ti/substrate was taken out of a system, and then provided for various quality tests. At this time, the graphene/Ti/substrate exposed to the atmosphere was substantially converted to a graphene/TiO$_2$/substrate due to rapid oxidation of Ti. However, hereinafter, the graphene/TiO$_2$/substrate oxidized by exposure to the atmosphere will be referred to as "graphene/Ti/substrate" for convenience.

In the Examples, the maximum size of the prepared target substrate was 4×4 cm$^2$ due to the limitation of the system, and a high-quality graphene thin film could also be grown to this size. However, this size limitation is due to the size limitation of the chamber and components used in the Examples, and thus when the target substrate is prepared using a system having an increased size, a graphene thin film can, of course, be grown to a larger size.

EXAMPLES

Example 1: Deposition of Titanium Buffer Layer

On each of SiO$_2$ (250 nm)/Si (001), Eagle glass (700 μm) and PET (130 μm) target substrates, a 10-nm titanium buffer layer was deposited using a 2-inch-diameter metal target (purity: 99.99%) by DC sputtering at room temperature under the following conditions: DC power of 20 W; working pressure of 0.4 Pa; and deposition time of 3 minutes. A previous experiment indicated that when the thickness of a deposited titanium buffer layer was thinner than 10 nm, the deposited thickness was not uniform (data not shown).

The thickness of the titanium buffer layer was measured by TEM cross-section imaging, the sheet resistance and transmittance thereof were measured using a four-point probe and a UV-vis spectrometer, respectively. The surface roughness of the titanium buffer layer annealed at various temperatures in a hydrogen atmosphere was measured using AFM (MFP-3D-BIO, Asylum Research) at room temperature in order to examine the thermal stability thereof.

FIG. 1 is a graph showing the results of the measurement.

The surface roughness or height of the titanium buffer layer was hardly affected by annealing (FIGS. 1a and 1b).

FIG. 1c is a graph showing the change in transmittance by deposition of the titanium buffer layer and annealing thereof. When the titanium buffer layer formed on the glass target substrate was annealed at 150° C. or 400° C., the transmittance at 550 nm was slightly decreased (by 0.4±0.05%) compared to that of the glass substrate itself.

For the Ti/PET target substrate annealed at 150° C., the transmittance was hardly changed by deposition or annealing of the titanium buffer layer (see the inset in FIG. 1c).

Regarding sheet resistance, the titanium buffer layer deposited on the target glass substrate showed a sheet resistance similar to that of the target substrate itself, and no great change was observed even when the titanium buffer layer was annealed at 400° C. in a hydrogen atmosphere (FIG. 1d).

In addition, in order to examine whether a source material used for graphene growth would affect the titanium buffer layer, a titanium buffer layer was formed on a glass target substrate, and then annealed in a CH$_4$ gas atmosphere, whether the surface roughness, light transmittance and sheet resistance of the target substrate would change was observed. As a result, even when the titanium buffer layer was annealed at 400° C. or 900° C. for 2 hours, changes in the surface properties (surface roughness, light transmittance and sheet resistance) of the target substrate were not observed (data not shown).

Comparative Example 1: Deposition of Other Metal Buffer Layers and Graphene Formation Each of 10-nm-thick Ni and Cu thin layers was formed on a glass substrate under the same conditions described in Example 1.

Figure 2A:
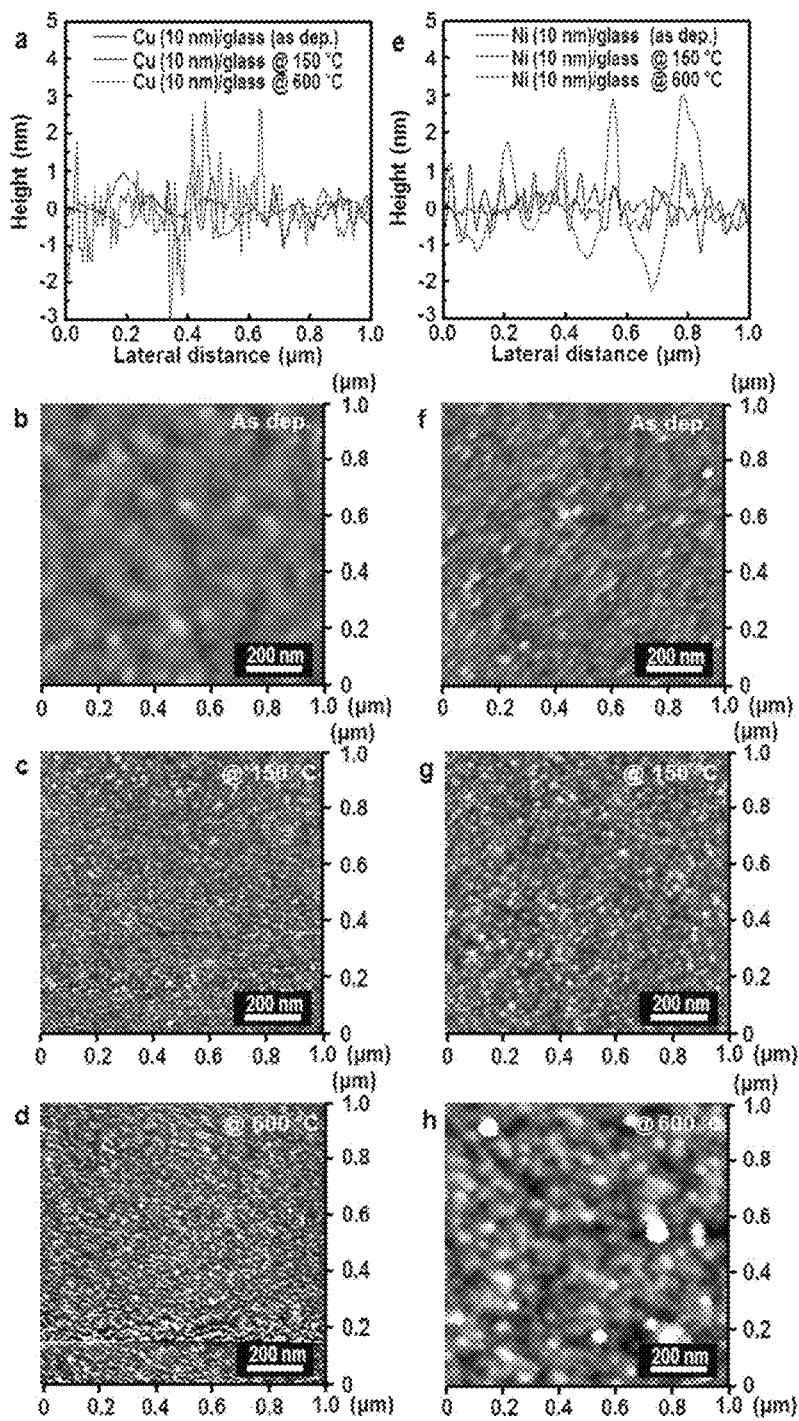
FIG. 2A depicts graphs and AFM images showing the changes in surface roughness by annealing of nickel and copper thin films.

When the nickel and copper thin layers on the glass target substrates were annealed at 150° C. or 600° C. in a hydrogen atmosphere, the surface roughness or transmittance greatly changed (see FIG. 2A). This indicates that the Ni or Cu thin layer for graphene is not suitable as a buffer layer for direct growth of graphene.

Figure 2B:
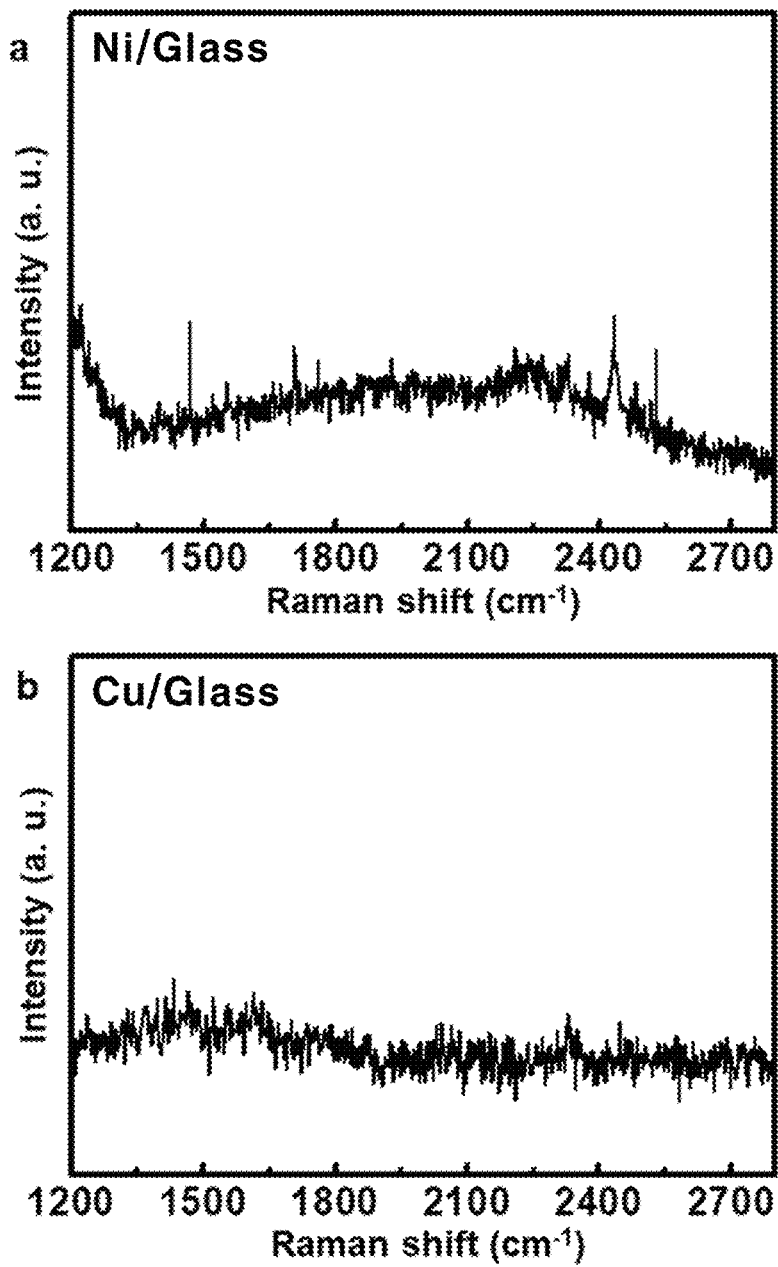
FIG. 2B depicts Raman spectral graphs showing that no graphene layer was formed on Ni/glass and Cu/glass substrates.

Furthermore, according to the same method described in Example 2 below, graphene growth on each of Ni/glass and Cu/glass substrates at 150° C. was attempted. Next, whether a graphene layer would be formed was analyzed using Raman spectra. As a result, as can be seen in FIG. 2B, a graphene layer was not formed on the Ni/glass and Cu/substrate under this condition.

Figure 3:
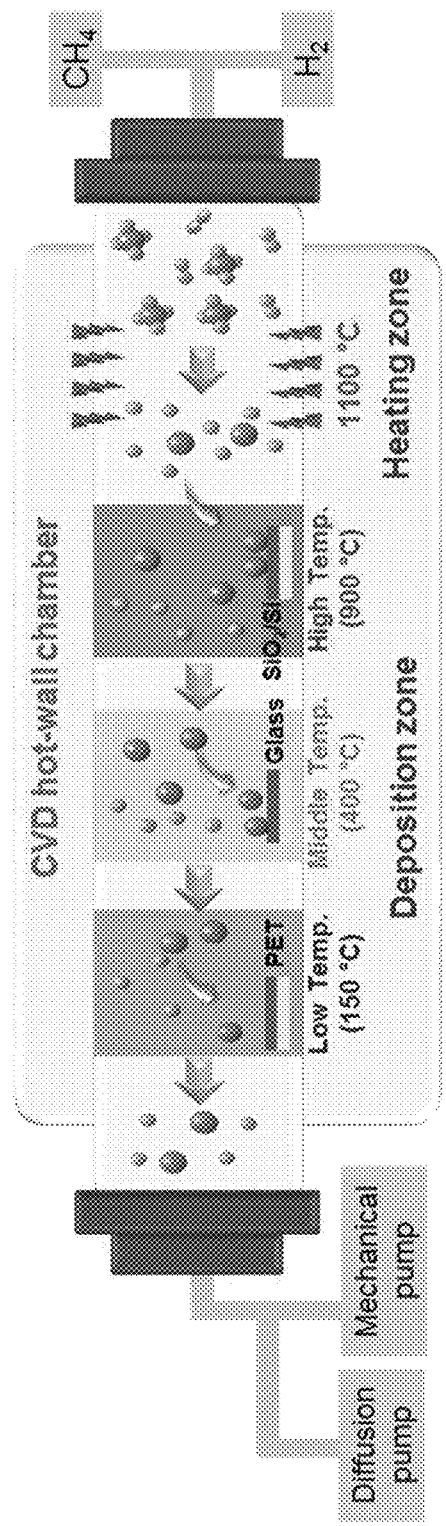
FIG. 3 is a schematic view of a chemical vapor deposition system used in a Comparative Example.

Comparative Example 2: Growth of Graphene by Conventional Chemical Vapor Deposition Using Ex-Situ Method According to the same procedures as those in a conventional method of forming a copper or nickel buffer layer by a sputtering process, the three target substrates, on which the titanium buffer layer was formed by the method of Example 1, were taken out of the sputtering system and immediately transferred into a 3-zone furnace (FIG. 3), and a graphene layer was formed thereon by conventional rapid thermal pulsed chemical vapor deposition (RTP-CVD) under the conditions selected by a previous experiment. During the transferring, the target substrates with Ti buffer layer were exposed to air.

Specifically, a titanium buffer layer was deposited on each target substrate in a sputtering system, and then each target substrate was transferred into a chamber for chemical vapor deposition. The temperature of a heating zone was maintained at 750° C. for 4 hours while 10 sccm of hydrogen gas was supplied in order to remove an oxide layer from the surface of the titanium buffer layer formed on the target substrate. At this time, the target substrate was maintained at a temperature of 150° C., and the internal pressure of the chamber was maintained at 0.6 Pa. It is known that titanium oxide is easily reduced by treatment with hydrogen plasma or in a hydrogen atmosphere.

Next, the temperature of the heating zone was elevated to 1100° C. so that CH$_4$ could be decomposed. Also, CH$_4$:H$_2$ (1:10-40 or (1-10)/10 sccm) was supplied as a reactive gas, and graphene was grown under a condition in which the temperature of the target substrate was 150° C. The working pressure was controlled in the range of 0.6 to 6.6 Pa.

In order to confirm that graphene was grown in the target substrate by the above-described method, Raman spectra were measured (UniRAM-5500, 532 nm laser), observation with AFM was performed, and EELS (electron energy-loss spectroscopy) mapping was performed. For ADF TEM, a 200 nm-thick SiO$_2$ layer was deposited on the graphene layer by plasma damage-free facing-target sputtering.

Figure 4:
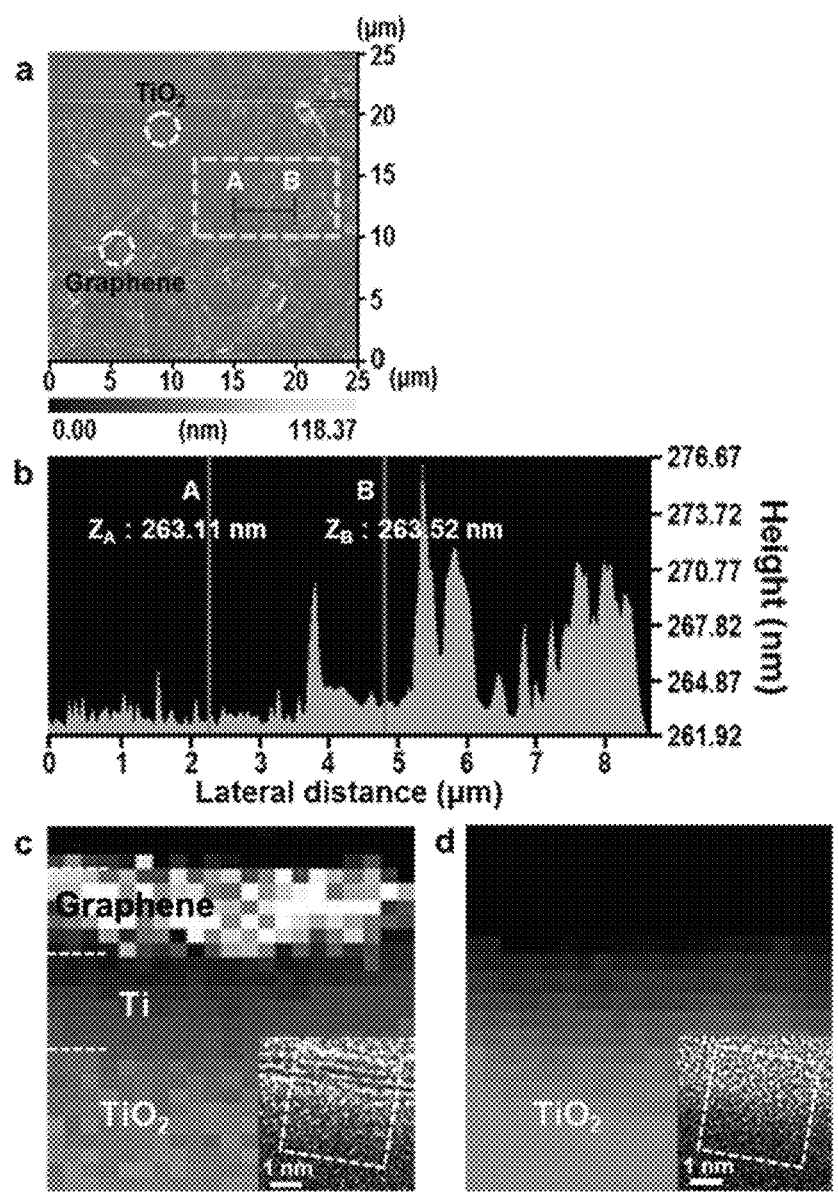
FIG. 4 depicts AFM images and EELS mapping images showing the characteristics of a graphene thin film produced in a Comparative Example.

FIG. 4 shows the results of analysis of the grown graphene layer. The AFM image of graphene (FIG. 4a) grown after annealing in a hydrogen atmosphere for 4 hours showed a clear contrast between the $TiO_2$ region and the graphene growth region. As shown in FIG. 4b showing the height profile along line A-B of FIG. 4a, a stepwise height difference of 0.41±0.03 nm, which was similar to the height of monolayer graphene (~0.33 nm), appeared. As clearly shown in FIGS. 4c and 4d showing EELS mapping, graphene grew in the region whose surface was Ti, whereas graphene did not grow in the $TiO_2$ region.

Among the above-described conditions, the following conditions made it possible to grow the best quality graphene at 150° C.: 4 hours of annealing in a hydrogen atmosphere; working pressure of 0.6 Pa; and $CH_4:H_2=1:10$. The $I_{2D}/I_G$, $I_D/I_G$ and FWHMs of 2D-band and G-band of the grown graphene thin film were 2.10±0.08, 0.02±0.01, 37±1 $cm^{-1}$ and 21±2 $cm^{-1}$, respectively.

However, despite 4 hours of annealing in a hydrogen atmosphere, it was difficult to realize grown graphene having an area larger than micrometers, due to residue of titanium oxide. Even when the time of annealing in a hydrogen atmosphere was increased to 5 hours, there was no change in the graphene growth area.

Example 2: Growth of High-Quality Graphene on Titanium Buffer Layer

It was believed that when the process of forming a titanium buffer layer and graphene was performed in a state in which an oxygen-free atmosphere was maintained, graphene could be produced with high quality. Accordingly, a system shown in FIG. 5 was constructed in which sputtering was integrated with plasma-enhanced chemical vapor deposition so that the entire process including a titanium buffer layer-forming step and a graphene-forming step could be maintained in an oxygen-free atmosphere.

Figure 5:
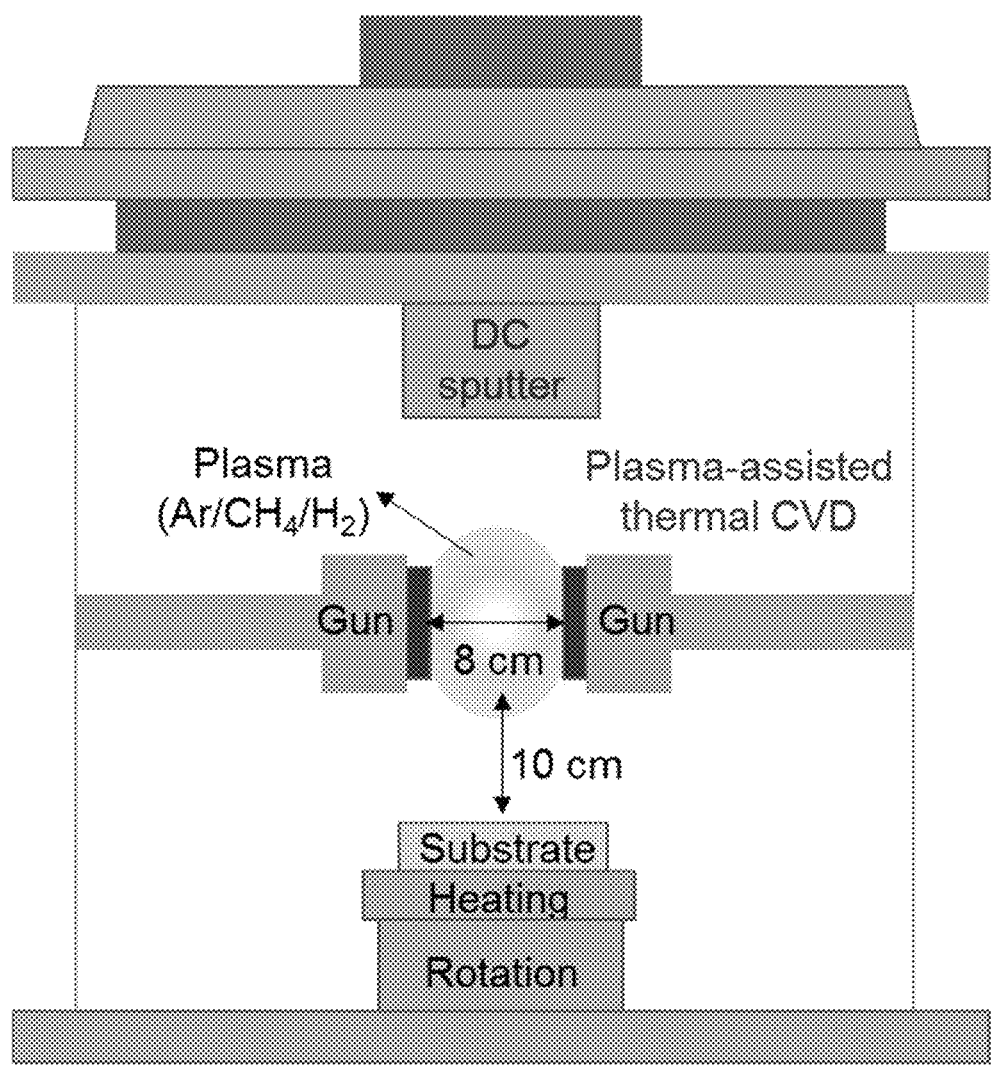
FIG. 5 is a schematic view of a system used in an Example of the present invention and making it possible to perform transfer-free deposition by sputtering and plasma-enhanced thermal CVD.

Using the system shown in FIG. 5, a titanium buffer layer was formed on a target substrate at low temperature in an oxygen-free atmosphere, and graphene was grown in-situ on the titanium buffer layer.

Specifically, on each of the above-described $SiO_2/Si$, glass and PET target substrates, a 10-nm-thick titanium buffer layer was formed by DC sputtering at 150° C. under the following conditions: DC power of 20 W; base pressure of $6.6 \times 10^{-4}$ Pa; working pressure of 0.4 Pa; and deposition time of 2.5 minutes. Immediately after deposition of the titanium buffer layer, a graphene thin film was grown by plasma-enhanced thermal CVD at 150° C. under the following conditions: rf power of 70 W; base pressure of $6.6 \times 10^{-4}$ Pa; working pressure of $2.4 \times 10^2$ Pa; growth time of 1.5 hours; $Ar/H_2/CH_4$ flow rates of 12/10/0.5 sscm; distance between rf anode and cathode of 8 cm; and distance between rf source and target substrate of 10 cm.

For ADF TEM to confirm graphene growth, a 200-nm-thick $SiO_2$ layer was deposited on the graphene layer via plasma damage-free facing-target sputtering. The Ti/glass target substrate in the graphene/Ti/glass target substrate was dissolved using hydrofluoric acid, and then the separated graphene monolayer was transferred onto a copper grid, and the crystallinity of the graphene was analyzed by TEM (HRTEM) and SAED (selected-area-electron-diffraction).

Figure 6:
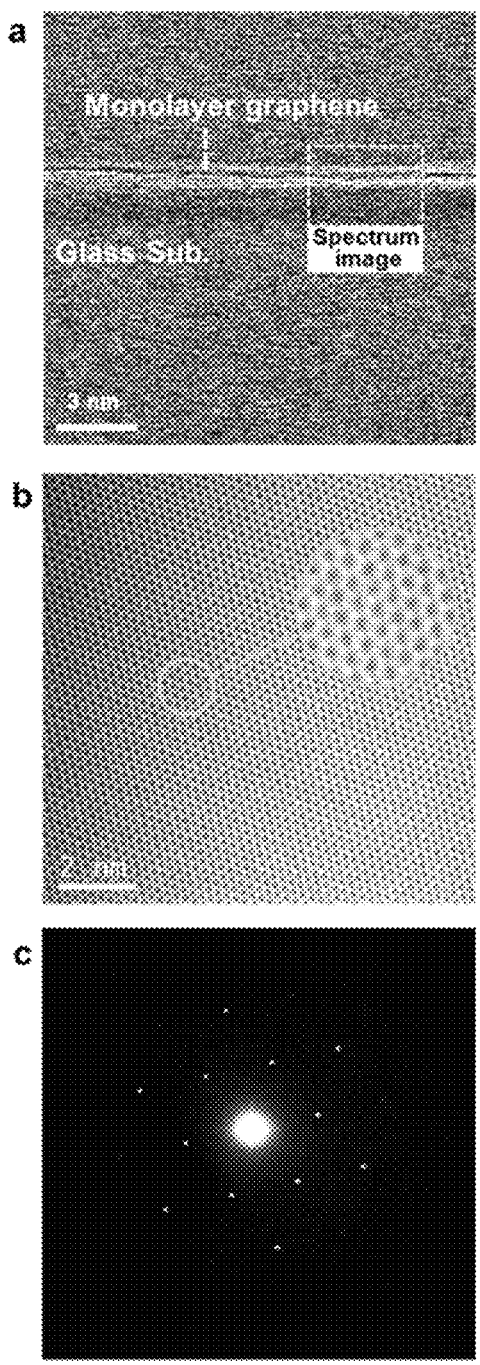
FIG. 6 depicts TEM images of a graphene thin film produced in an Example of the present invention.

FIGS. 6a to 6c show the ADF TEM bright field image, HRTEM image and HRTEM SAED of the graphene/Ti/glass substrate, respectively. As can be seen in FIG. 6a, a monolayer graphene thin film was grown by the above-described method, and as can be seen in FIGS. 6b and 6c, a graphene thin film having excellent crystallinity was formed.

Example 3: Evaluation 1 of Characteristics of Graphene

Figure 7:
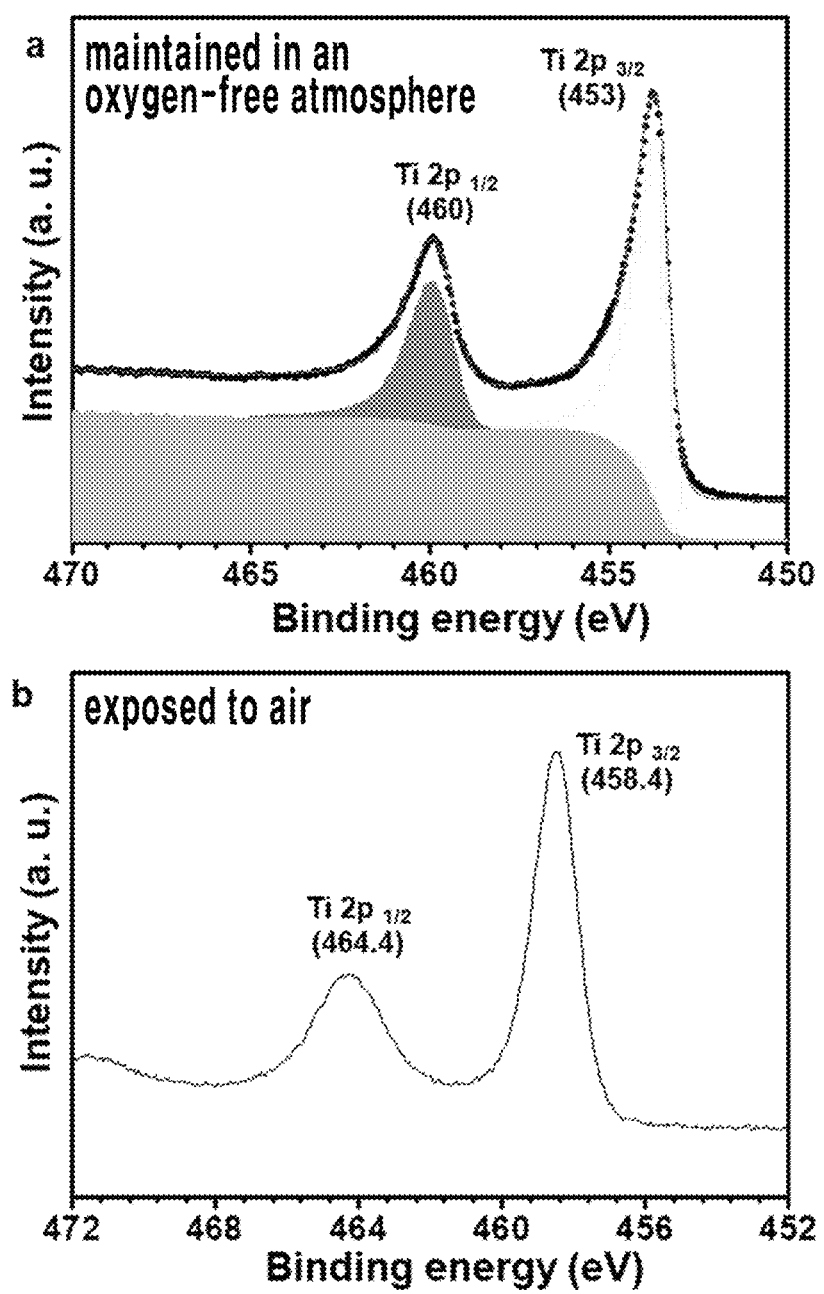
FIG. 7 depicts graphs showing the XPS Ti 2p core level obtained by analyzing the oxidized state of Ti after a Ti film was deposited by DC sputtering in an oxygen-free atmosphere and graphene was grown on Ti/PET.

To analyze the energy characteristic of Ti in the graphene/Ti/substrate obtained in Example 1, the graphene/Ti/PET was measured by XPS (FIG. 7).

It was shown that Ti in the Ti/PET maintained in an oxygen-free state had a binding energy of Ti $2p_{1/2}=460$ ev, Ti $2p_{3/2}=453$ ev, whereas the binding energy of Ti in the graphene/Ti/PET, taken out of the system after production and exposed to air, was Ti $2p_{1/2}=464.4$ ev, Ti $2p_{3/2}=458.4$ ev, indicating that the Ti had a $TiO_2$ phase. This suggests that the produced graphene/Ti/substrate was oxidized quickly to a graphene/$TiO_2$/substrate by exposure to an external environment.

Meanwhile, the electrical conductivity of Ti is $2.3 \times 10^4$/Ωcm, whereas the electrical conductivity of $TiO_2$ is extremely as low as $1.65 \times 10^{-10}$/Ωcm. Therefore, in an actual use environment (atmospheric exposure), Ti is immediately oxidized to $TiO_2$ which is an insulator, and thus the Ti film does not substantially exhibit electrical characteristics. This demonstrates that $TiO_2$ in the graphene/$TiO_2$/substrate produced by the method of the present invention substantially acts as an insulator, and thus the graphene/$TiO_2$/substrate may be applied directly to a device or a transparent conductive layer without removing the $TiO_2$ layer, that is, without a transfer process.

Example 4: Evaluation 2 of Characteristics of Graphene

Figure 8A:
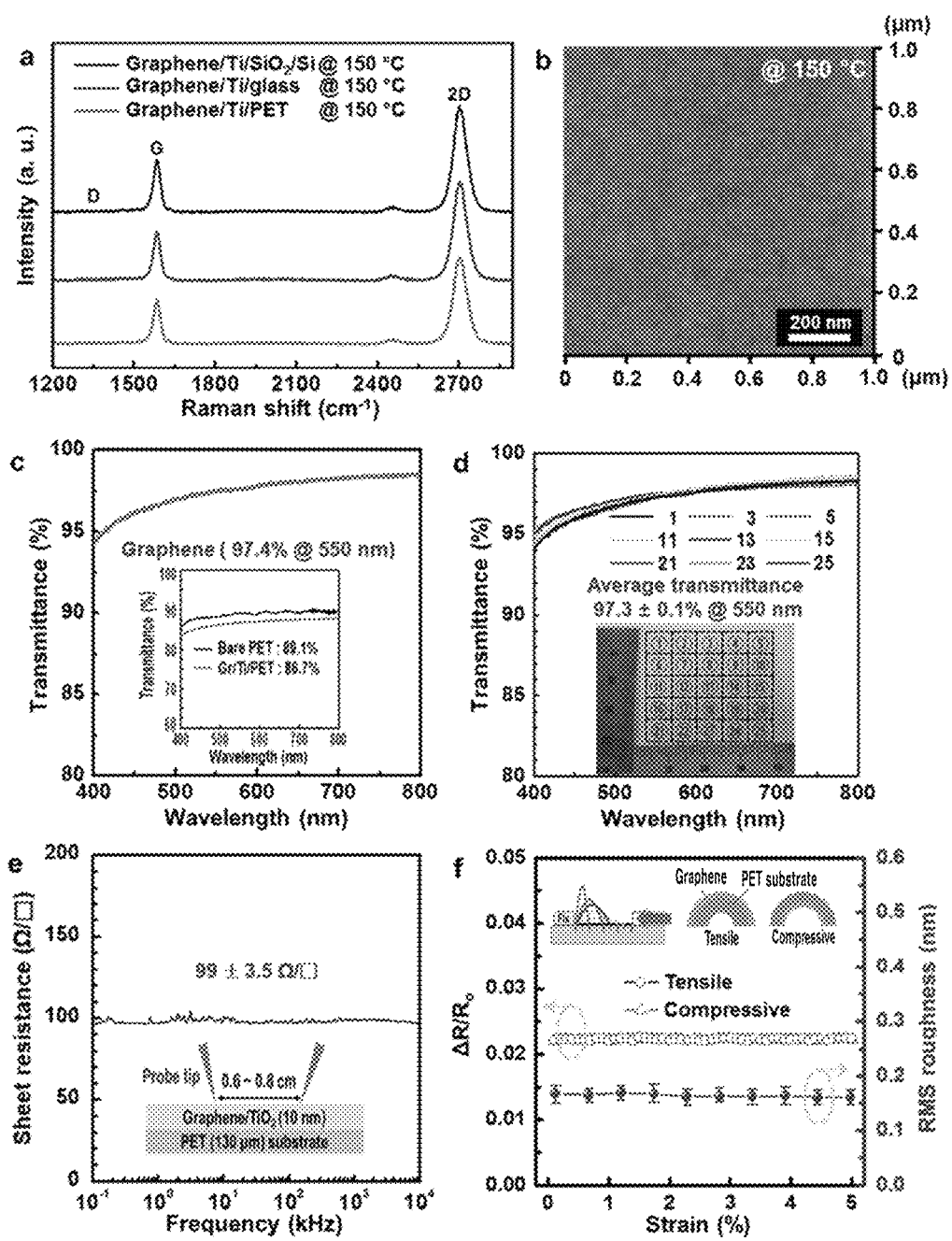
FIGS. 8A and 8B depict graphs and AFM images showing the optical and electrical properties of a graphene thin film produced in an Example of the present invention.
Figure 8B:
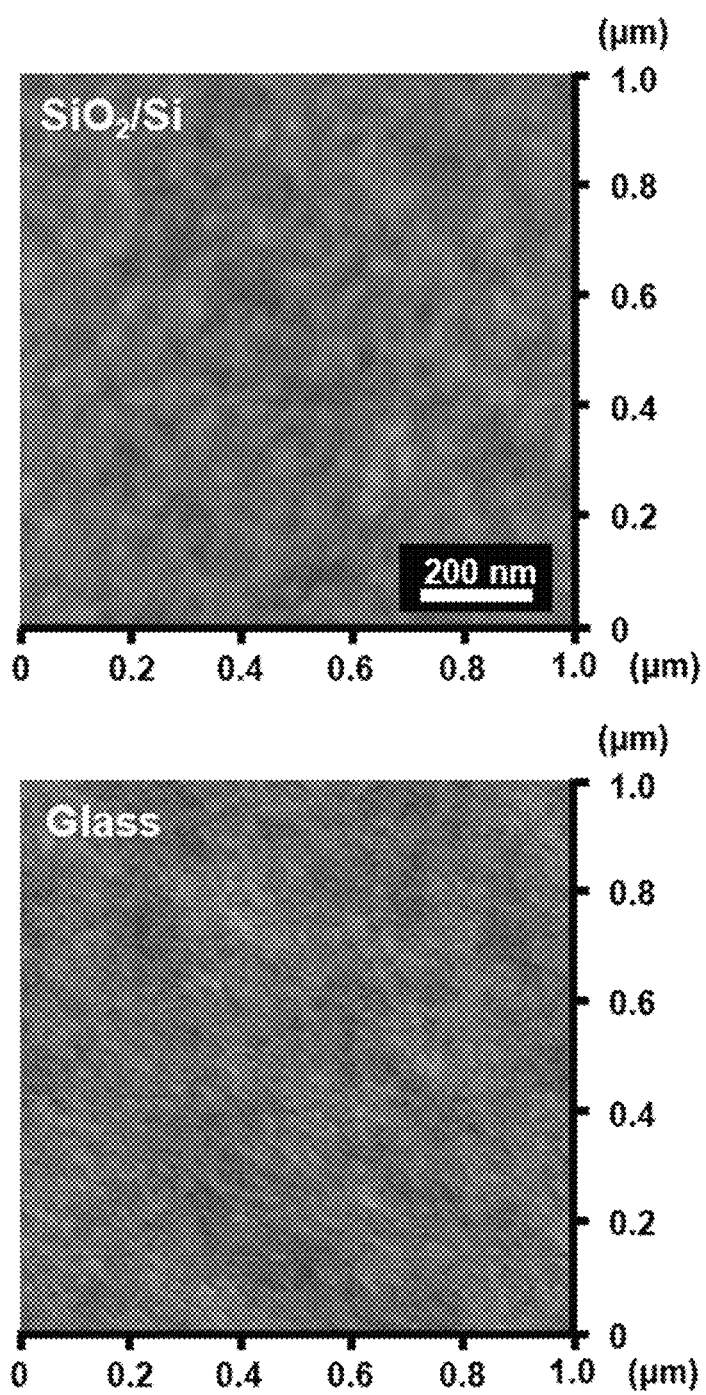

The various characteristics of the graphene layer in each of the graphene/Ti/$SiO_2$/Si, graphene/Ti/glass and graphene/Ti/PET obtained in Example 2 were evaluated, and the results are shown in FIG. 8A and FIG. 8B. Transmittance was measured by UV-vis spectrometry, and the sheet resistance of the graphene was measured within a range from 100 Hz to 10 MHz by the Z-theta method using an impedance/gain-phase analyzer (HP4194A). The reliability of the Z-theta method was confirmed by measuring sheet resistance by a four-point probe and the Z-theta method for graphene transferred onto an ITO thin film (data not shown). The carrier concentration, mobility and resistivity of the graphene were measured using 13 different samples by the van der Pauw four probes method (HMS-3000, ECOPIA) at room temperature. The flexibility of a graphene/Ti/PET having a size of 4×4 $cm^2$ was evaluated based on changes in sheet resistance and surface roughness as a function of tensile strain and compressive strain upon bending. Bending was repeated 10 times for each strain.

"a" of FIG. 8A shows the Raman spectrum of graphene grown on various target substrates, and shows that a high-quality defect-free graphene monolayer was formed. $I_{2D}/I_G$ and $I_D/I_G$ were 2.1±0.05 and 0.01±0.01, respectively. This $I_D/I_G$ ratio was superior to that of the graphene ($I_D/I_G=0.3$) synthesized directly on $SiO_2$ by chemical vapor deposition at 800° C., and was comparable to the quality of defect-free monocrystalline graphene synthesized on hydrogen-terminated germanium at 900 to 930° C. ($I_D/I_G<0.03$). The FWHMs of the 2D-band and the G-band were 28±1 and 14±1 $cm^{-1}$, respectively, which were better than those of the graphene produced in the Comparative Example.

"b" of FIG. 8A is an AFM images of graphene/Ti/PET, and shows that the graphene thin film is free of mechanical defects such as wrinkles. The surface roughness of graphene/Ti/PET was 0.17±0.02 nm. Similar results were also obtained when SiO$_2$/Si and glass were used as target substrates (FIG. 8B).

"a" and "b" of FIG. 8A show that graphene obtained by the transfer-free method of graphene at low temperature according to the present invention is high-quality graphene which is sufficient for use as a device, a transparent electrode or the like.

As can be seen in of FIG. 8A, the obtained (monolayer) graphene/Ti/PET showed high transmittance in the visible wavelength range (97.4±1% at 550 nm relative to the Ti/PET target substrate). The inset graph in "c" of FIG. 8A shows that the transmittance of graphene/Ti/PET at 550 nm (86.7%) was slightly (about 2.3±0.1%) lower than the transmittance of the PET target substrate itself (89.1%). Similar results were also obtained when SiO$_2$/Si and glass were used as target substrates (FIG. 8B).

The graphene thin film grown to a large area (4×4 cm$^2$) was divided into 25 portions according to the beam size (0.8 cm) of the UV-vis spectrometer used, and then the transmittance of each portion was measured. The results are shown in "d" of FIG. 8A. As can be seen in the graph, the large-area graphene formed by the present invention showed uniform transmittance over the entire surface. For example, the transmittance at 550 nm was 97.3±1% and did not substantially change depending on the measurement position.

"c" and "d" of FIG. 8A demonstrate that even when the graphene/Ti/target substrate produced according to the method of the present invention is used directly in a device or a transparent electrode via a transfer-free method, there is no particular problem in the transmittance thereof.

The sheet resistance ("e" of FIG. 8A) of the monolayer graphene of the graphene/Ti/PET produced in Example 2 was 99±3.5 Ω/□, which was lower than the sheet resistance of monolayer graphene (~125 Ω/□) formed using copper substrates as in a conventional art (Roll-to-roll production of 30-inch graphene films for transparent electrodes: Bae et al., NATURE NANOTECHNOLOGY, VOL 5, AUGUST 2010). The carrier concentration, mobility and resistivity of the large-area graphene, measured at room temperature, were (8.93±0.29)×10$^{12}$ cm$^{-2}$, (7.04±0.03)×10$^3$ cm$^2$V$^{-1}$ s$^{-1}$, and (3.96±0.14)×10$^{-6}$ Ω-cm, respectively. The sheet resistance of the graphene, calculated using the above-described results such as carrier concentration, was 99±3.0 Ω/□, which was consistent with the result measured by the Z-theta method. This suggests that the graphene layer in the graphene/Ti/substrate produced according to the present invention shows sufficiently low sheet resistance characteristics, and thus the graphene/Ti/substrate may be used directly to a device or a transparent electrode via a transfer-free method.

"f" of FIG. 8A is a graph showing changes in the sheet resistance and surface roughness as a function of tensile strain and compressive strain of the graphene/Ti/PET according to the present invention. As can be seen therein, the graphene/Ti/PET showed no change in the sheet resistance or surface roughness thereof in a bending test, indicating that it had very excellent flexibility. This stability against various strains is believed to be because graphene was strongly bonded to the target substrate by bonding between oxygen originating from graphene and the Ti layer and bonding between the Ti layer and oxygen originating from the target substrate. This characteristic is in contrast with that of a graphene on a PET target substrate via a transfer process according to a conventional art, and indicates that the graphene/Ti/PET produced by the transfer-free method of the present invention may be effectively applied to a flexible device.

Example 5: Application to Flexible and Transparent Thin Film Capacitor

In recent years, attempts have been made to imbed passive components (80% of electronic components) such as capacitors into printed circuit boards (PCBs). In addition, electronic devices are designed to be flexible, and thus flexibility becomes a major requirement for electrodes and materials a high dielectric constant. Up to now, the bottom electrodes in embedded and flexible thin-film capacitors have been fabricated by transferring graphene, growth on Ni catalyst layers, onto flexible target substrates.

In this Example, the graphene thin film of graphene/Ti/PET produced in Example 2 was used as a bottom electrode, and a graphene thin film grown on titanium at 150° C. was used as a top electrode, thereby fabricating a flexible and transparent thin-film capacitor, and the characteristics of the capacitor were evaluated. It was reported that 200 nm-thick BMNO (Bi$_2$Mg$_{2/3}$Nb$_{4/3}$O$_7$) pyrochore thin films deposited onto copper-clad laminate and Pt/TiO$_2$/Si substrates at room temperature showed a high dielectric constant of 40-60 at 100 kHz and a low leakage current density of 10$^{-8}$ A/cm$^2$ t room temperature. Thus, BMNO was chosen as a dielectric material. On the graphene/Ti/PET substrate having a size of 4×4 cm$^2$, produced by the method of Example 2, a 200 nm-thick BMNO dielectric thin film was formed by plasma damage-free FTS (facing-target sputtering) under the following conditions: rf power of 100 W; working pressure of 0.65 Pa; and Ar/O$_2$ flow rates of 10/10 sccm. For formation of a top electrode, a disk-shaped titanium buffer layer having a diameter of 150 μm and a thickness of 10 nm was deposited on the BMNO thin film according to the same method as the method of Example 1, and 10 nm-thick graphene was grown thereon at 150° C. Raman mapping indicated that the graphenes grown as the top electrode and the bottom electrode were formed as monolayer graphene (FIG. 9a).

Figure 9:
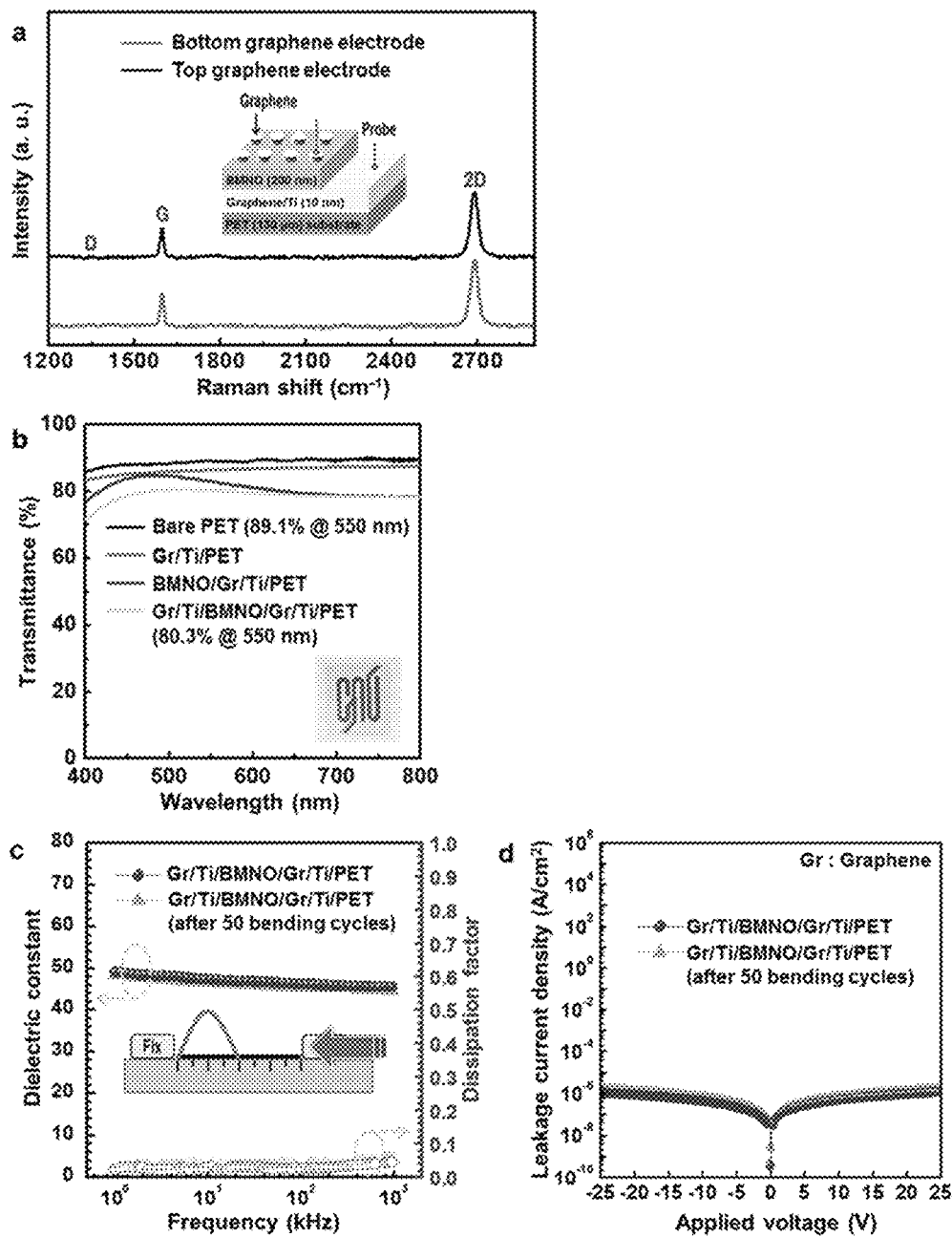
FIG. 9 depicts graphs showing the optical and electrical properties of a thin-film capacitor fabricated using a graphene thin film in an Example of the present invention.

As shown in FIG. 9b, the transmittance of the flexible thin-film capacitor at 550 nm (80.4±0.2%) fabricated in this Example was slightly lower than the transmittance of PET (89.2±0.2%), but was so transparent that the logo image at the bottom of the thin-film capacitor could be clearly seen.

The dielectric properties of the BMNO thin films were measured as a function of frequency using an impedance/gain-phase analyzer (HP4194A), and the results are shown in FIG. 9c. The dielectric constant for the capacitor was 47-49 at a frequency of 100 kHz, which showed slight dielectric dispersion with increases in the frequency. The dielectric loss (dissipation factor) of the capacitor was maintained at 0.03±0.003 at 100 kHz.

Figure 10:
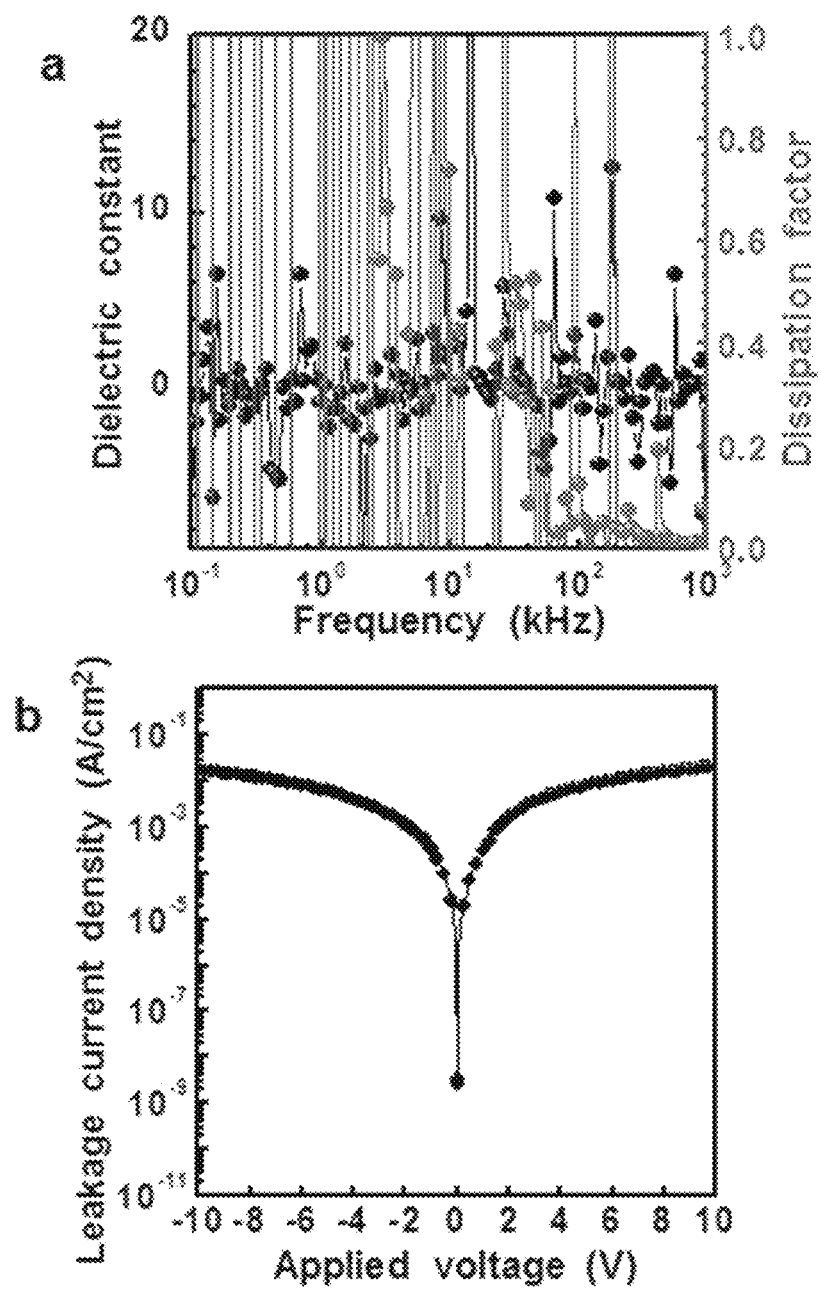
FIG. 10 depicts graphs the electrical properties of a thin-film capacitor according to a Comparative Example.

For comparison, a thin-film capacitor was fabricated using a top electrode having only a Ti layer (substantially, only a TiO$_2$ layer) having no graphene layer formed thereon, and the dielectric characteristics and leakage current characteristics thereof were measured. As a result, the capacitor for comparison showed very unstable dielectric characteristics and a high leakage current value (FIG. 10). Thus, it can be seen that the excellent characteristics of the capacitor in this Example are attributable to the graphene layer, not the Ti layer, and that the Ti layer (substantially, a TiO$_2$ layer) does not affect the electrical characteristics of the capacitor.

To examine the flexibility of the graphene/Ti/BMNO/graphene/Ti/PET capacitor, a bending test was performed to evaluate the dielectric and leakage current characteristics of the BMNO thin-film capacitor (FIGS. 9c and 9d). The leakage current characteristics of the BMNO capacitor were investigated by HP4156B semiconductor parameter analysis. For the bending test, one side of a sample having a size of 4×4 cm² was fixed, and the other side was subjected to a tensile strain of 3.0% and depressed for 30 seconds. After 50 bending cycles, the dielectric constant decreased 2.2% at 100 kHz, and the leakage current increased 3.0% at 10 V, indicating that the changes were insignificant. This confirms that the layered structure on the flexible target substrate (e.g., graphene/Ti/PET), produced the transfer-free method for graphene production according to the present invention, may be applied to a flexible and transparent electronic device or a transparent electrode.

As described above, the method for producing a graphene thin film according to the present invention makes it possible to grow a defect-free, monocrystalline graphene thin film over a large area on a target substrate without changing the transparency and electrical properties of the target substrate, and thus can produce good-quality graphene by a transfer-free method.

Furthermore, according to the method of the present invention, graphene with excellent crystallinity can be grown even when the temperature of the target substrate is as low as 400° C. or below, particularly 150° C. Accordingly, a graphene layer can be grown directly using a flexible target substrate made of a polymer material such as PET, thus providing a flexible device or a transparent electrode.

A monolayer graphene thin film produced by the method of the present invention has excellent electrical properties such as mobility and resistance, and thus can substitute for metals such as copper, which are used in flexible electronic devices.

What is claimed is:

1. A transfer-free method for producing a transparent electrode comprising a graphene thin film, comprising the steps of:
    (A) forming a titanium buffer layer on a target substrate, the transmittance of the titanium buffer layer formed substrate at 550 nm being decreased by 0.4±0.05% compared to that of the target substrate itself; and
    (B) growing a graphene thin film on the titanium buffer layer, wherein entire steps throughout (A) to (B) are performed in-situ in the same system, and thus performed in an oxygen-free atmosphere in which titanium is not oxidized, $I_D/I_G$ of the graphene thin film is 0.01±0.01, and the graphene thin film is made of monolayer graphene,
    wherein the transmittance of graphene thin film formed substrate at 550 nm being 97.4±1% relative to the titanium buffer layer formed substrate.

2. The transfer-free method for producing a transparent electrode of claim 1, wherein the steps of forming the titanium buffer layer and the graphene thin film are repeated after step (B).

3. The transfer-free method for producing a transparent electrode of claim 1, wherein the steps are performed at 400° C. or below.

4. The transfer-free method for producing a transparent electrode of claim 1, wherein the forming of the titanium buffer layer in step (A) is performed by a method selected from the group consisting of sputtering, atomic layer deposition (ALD), plasma-enhanced atomic layer deposition (PE-ALD), thermal evaporation, thermal oxidation, e-beam evaporation, molecular beam epitaxy (MBE), pulsed laser deposition (PLD), chemical vapor deposition (CVD), a sol-gel method, and combinations thereof, and
    the growing of the graphene thin film in step (B) is performed by a chemical vapor deposition method selected from the group consisting of plasma-enhanced chemical vapor deposition (PECVD), rapid thermal chemical vapor deposition (RTCVD), inductively coupled plasma-chemical vapor deposition (ICP-CVD), low-pressure chemical vapor deposition (LPCVD), atmospheric pressure chemical vapor deposition (APCVD), metal organic chemical vapor deposition (MOCVD), atomic layer deposition (ALD), plasma-enhanced atomic layer deposition (PE-ALD), and combinations thereof.

5. The transfer-free method for producing a transparent electrode of claim 1, wherein the titanium buffer layer has a thickness of 10 to 20 nm.

6. The transfer-free method for producing a transparent electrode of claim 1, wherein the target substrate is made of glass, SiO2, or a synthetic resin containing an oxygen atom in its structure.

7. The transfer-free method for producing a transparent electrode of claim 2, wherein the steps are performed at 400° C. or below.

8. The transfer-free method for producing a transparent electrode of claim 2, wherein the forming of the titanium buffer layer in step (A) is performed by a method selected from the group consisting of sputtering, atomic layer deposition (ALD), plasma-enhanced atomic layer deposition (PE-ALD), thermal evaporation, thermal oxidation, e-beam evaporation, molecular beam epitaxy (MBE), pulsed laser deposition (PLD), chemical vapor deposition (CVD), a sol-gel method, and combinations thereof, and
    the growing of the graphene thin film in step (B) is performed by a chemical vapor deposition method selected from the group consisting of plasma-enhanced chemical vapor deposition (PECVD), rapid thermal chemical vapor deposition (RTCVD), inductively coupled plasma-chemical vapor deposition (ICP-CVD), low-pressure chemical vapor deposition (LPCVD), atmospheric pressure chemical vapor deposition (APCVD), metal organic chemical vapor deposition (MOCVD), atomic layer deposition (ALD), plasma-enhanced atomic layer deposition (PE-ALD), and combinations thereof.

9. The transfer-free method for producing a transparent electrode of claim 2, wherein the titanium buffer layer has a thickness of 10 to 20 nm.

10. The transfer-free method for producing a transparent electrode of claim 2, wherein the target substrate is made of glass, $SiO_2$, or a synthetic resin containing an oxygen atom in its structure.

11. A transfer-free method for fabricating a transparent electronic device comprising a graphene thin film, the method comprising the steps of:
    (A) forming a titanium buffer layer on a target substrate, the transmittance of the titanium buffer layer formed substrate at 550 nm being decreased by 0.4±0.05% compared to that of the target substrate itself;
    (B) forming a graphene thin film on the titanium buffer layer, wherein entire steps throughout (A) to (B) are performed in-situ in the same system, and thus performed in an oxygen-free atmosphere in which titanium is not oxidized, $I_D/I_G$ of the graphene thin film is 0.01±0.01, and the graphene thin film is made of monolayer graphene, wherein the transmittance of graphene thin film formed substrate at 550 nm being 97.4±1% relative to the titanium buffer layer formed substrate; and (C) fabricating the electrical device by using the target substrate.

12. The transfer-free method of claim 11, further comprising, before step (A) or (B), a step of forming a masking pattern having a predetermined shape.

13. The transfer-free method of claim 11, wherein steps (A) and (B) are all performed at 400° C. or below.

14. The transfer-free method of claim 12, wherein steps (A) and (B) are all performed at 400° C. or below.

* * * * *